US008013616B2

(12) United States Patent
Crumlin et al.

(10) Patent No.: US 8,013,616 B2
(45) Date of Patent: Sep. 6, 2011

(54) TYPE A USB RECEPTACLE WITH PLUG DETECTION

(75) Inventors: Alex Crumlin, San Jose, CA (US); Aaron Leiba, San Francisco, CA (US); David Ferguson, Sunnyvale, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 12/974,272

(22) Filed: Dec. 21, 2010

(65) Prior Publication Data

US 2011/0093624 A1 Apr. 21, 2011

Related U.S. Application Data

(60) Continuation of application No. 12/614,125, filed on Nov. 6, 2009, now Pat. No. 7,880,475, which is a division of application No. 12/182,976, filed on Jul. 30, 2008, now Pat. No. 7,635,280.

(51) Int. Cl.

*G01R 31/02* (2006.01)
*G06F 3/00* (2006.01)

(52) U.S. Cl. .......................................... 324/539; 710/16

(58) Field of Classification Search .................. 324/538, 324/539

See application file for complete search history.

(56) References Cited

U.S. PATENT DOCUMENTS

| | | | |
|---|---|---|---|
| 5,295,843 | A | 3/1994 | Davis et al. |
| 5,741,151 | A | 4/1998 | Youngers |
| 5,884,086 | A | 3/1999 | Amoni et al. |
| 5,902,154 | A | 5/1999 | Nakata |
| 5,997,343 | A | 12/1999 | Mills et al. |
| 6,314,479 | B1 | 11/2001 | Frederick et al. |
| 6,334,793 | B1 | 1/2002 | Amoni et al. |
| 6,431,893 | B1 | 8/2002 | Chang et al. |
| 6,626,697 | B1 | 9/2003 | Martin et al. |
| 6,648,661 | B1 | 11/2003 | Byrne et al. |
| 6,688,899 | B2 | 2/2004 | Rumpel |
| 6,719,577 | B2 | 4/2004 | Nogami |
| 6,722,924 | B1 | 4/2004 | Zhou et al. |
| 6,745,267 | B2 | 6/2004 | Chen et al. |

(Continued)

FOREIGN PATENT DOCUMENTS

EP 1 274 151 A2 * 1/2003

(Continued)

OTHER PUBLICATIONS

Bannan, James, "USB 3.0 connectors on display" *APC*, Jan. 21, 2008, [Retrieved on Apr. 9, 2008]. Retrieved from the Internet: http://apcmag.com//usb_30_connectors_on_display.htm; 3 pages.*

(Continued)

*Primary Examiner* — Vincent Q Nguyen

(74) *Attorney, Agent, or Firm* — Kilpatrick Townsend & Stockton LLP

(57) ABSTRACT

A modified Series A universal serial bus (USB) receptacle connector is equipped with the functionality to allow the electronic system in which it resides to be configured either as a host device or a peripheral device. The modified USB Series A receptacle connector, according to one embodiment of the invention may include a mechanism such as an additional pin or a mechanical switch to detect the presence of a standard USB Series A plug being inserted into it. Upon detection of a plug, an algorithm may allow the system to determine whether it is to act as a host device or a peripheral device and to determine which device supplies power.

19 Claims, 10 Drawing Sheets

U.S. PATENT DOCUMENTS

| | | | |
|---|---|---|---|
| 6,837,725 B1 | 1/2005 | Gordon et al. | |
| 6,854,984 B1 | 2/2005 | Lee et al. | |
| 6,869,290 B2 | 3/2005 | Brown et al. | |
| 6,980,422 B2 | 12/2005 | Bhogal | |
| 7,004,787 B2 | 2/2006 | Milan | |
| 7,021,971 B2 | 4/2006 | Chou et al. | |
| 7,125,287 B1 | 10/2006 | Chou et al. | |
| 7,128,608 B1 * | 10/2006 | Chen | |
| 7,128,617 B2 * | 10/2006 | Wang et al. | |
| 7,137,836 B2 * | 11/2006 | Lu et al. | |
| 7,152,190 B2 * | 12/2006 | Overtoom | |
| 7,186,147 B1 * | 3/2007 | Chou et al. | |
| 7,193,442 B2 * | 3/2007 | Zhu | |
| 7,207,819 B2 * | 4/2007 | Chen | |
| 7,311,537 B2 * | 12/2007 | Hsu | |
| 7,329,153 B2 * | 2/2008 | Lin et al. | |
| 7,384,295 B2 * | 6/2008 | Hankey et al. | |
| 7,635,280 B1 * | 12/2009 | Crumlin et al. | |
| 7,880,475 B2 * | 2/2011 | Crumlin et al. | |
| 2004/0026516 A1 | 2/2004 | Liu et al. | |
| 2004/0027812 A1 | 2/2004 | Yen | |
| 2004/0182938 A1 | 9/2004 | Chen et al. | |
| 2006/0063422 A1 | 3/2006 | Lu et al. | |
| 2006/0154530 A1 | 7/2006 | Novotney | |
| 2007/0010116 A1 | 1/2007 | Teicher | |
| 2007/0077811 A1 | 4/2007 | Kim et al. | |
| 2007/0143505 A1 | 6/2007 | Terrell, II | |
| 2009/0108848 A1 * | 4/2009 | Lundquist et al. | 324/538 |

FOREIGN PATENT DOCUMENTS

WO WO 2006/045243 A1 * 5/2006

OTHER PUBLICATIONS

Luke, David, "Linking Mobiles with USB: A Look at the OTG Supplement", [Retrieved on Apr. 9, 2008]. Retrieved from the Internet: http://www.commsdesign.com/article/printableArticle.jhtml?articleID=16500233, Jan. 9, 2003; 7 pages.

"USB On-The-Go Basics", [Retrieved on Apr. 9, 2008]. Retrieved from the Internet: www.maxim-ic.com/appnotes.cfm/appnotenumber/1822, Dec. 20, 2002; 6 pages.

"Universal Serial Bus Specification", [Retrieved on Apr. 9, 2008], Retrieved from the Internet: www.usb.org/developers/docs/usb_20_040908.zip, Apr. 27, 2000: 650 pages.

"On-The-Go Supplement to the USB 2.0 Specification Revision 1,3", [Retrieved on Apr. 9, 2008]. Retrieved from the Internet: www.usb.org/developers/docs/usb_otg_1-3,pdf, Dec. 5, 2006; 8 pages.

Photo No. 14, [Retrieved on Apr. 9, 2008]. Retrieved from the Internet: http://www.engadget.com/photos/usb-3-0-in-the-flesh-1/571959/; 2 pages.

Photo No. 13. [Retrieved on Apr. 9, 2008]. Retrieved from the Internet: http://www.engadget.com/photos/usb-3-0-in-the-flesh-1/571960/; 1 page.

Photo No. 12. [Retrieved on Apr. 9, 2008], Retrieved from the Internet: http://www.engadget.com/photos/usb-3-0-in-the-flesh-1/571961/; 1 page.

Photo No. 11. [Retrieved on Apr. 9, 2008]. Retrieved from the Internet: http://www.engadget.com/photos/usb-3-0-in-the-flesh-l/571962/; 1 page.

Photo No. 10. [Retrieved on Apr. 9, 2008]. Retrieved from the Internet: http://www.engadget.com/photos/usb-3-0-in-the-flesh-1/571963/; 1 page.

Photo No, 9, [Retrieved on Apr. 9, 2008]. Retrieved from the Internet: http://www.engadget.com/photos/usb-3-0-in-the-flesh-1/571964/; 2 pages.

Photo No. 8. [Retrieved on Apr. 9 2008]. Retrieved from the Internet: http://www.engadget.com/photos/usb-3-0-in-the-flesh-1/571965/; 1 page.

Photo No. 7. [Retrieved on Apr. 9, 2008]. Retrieved from the Internet: http://www.engadget.com/photos/usb-3-0-in-the-flesh-1/571966/; 1 page.

Photo No. 6. [Retrieved on Apr. 9, 2008]. Retrieved from the Internet: http://www.engadget.com/photos/usb-3-0-in-the-flesh-1/571974/; 1 page.

Photo No, 5. [Retrieved on Apr. 9, 2008]. Retrieved from the Internet: http://www.engadget.com/photos/usb-3-0-in-the-flesh-1/571975/; 1 page.

Photo No. 4. [Retrieved on Apr. 9, 2008]. Retrieved from the Internet: http://www.engadget.com/photos/usb-3-0-in-the-flesh-1/571976/; 1 page.

Photo No. 3. [Retrieved on Apr. 9, 2008]. Retrieved from the Internet: http://www.engadget.com/photos/usb-3-0-in-the-flesh-1/571977/; 1 page.

Photo No. 2. [Retrieved on Apr. 9, 2008]. Retrieved from the Internet: http://www.engadget.com/photos/usb-3-0-in-the-flesh-1/571978/; 1 page.

Photo No, 1. [Retrieved on Apr. 9, 2008]. Retrieved from the Internet: http://www.engadget.com/photos/usb-3-0-in-the-flesh-1/571979/: 2 pages.

"USB OTG Overview", *Presentations* from the USB On-The-Go training seminar in San Jose, California, Aug. 31, 2004(zip,3,03 MB) [Retrieved on Apr. 9, 2008]. Retrieved from the Internet: http://www.usb.otg/developers/onthego/san_jose_org_presentations.zip; 30 pages.

* cited by examiner

TYPE A USB RECEPTACLE WITH PLUG DETECTION

CROSS-REFERENCE TO RELATED APPLICATIONS

The present application is a continuation of U.S. application Ser. No. 12/614,125, filed Nov. 6, 2009, now U.S. Pat. No. 7,880,475, issued Feb. 1, 2011, entitled "TYPE A USB RECEPTACLE TO WITH PLUG DETECTION," which is a divisional application of U.S. application Ser. No. 12/182,976, filed Jul. 30, 2008, now U.S. Pat. No. 7,635,280, issued Dec. 22, 2009, entitled "TYPE A USB RECEPTACLE WITH PLUG DETECTION." The entire contents of these applications are incorporated herein by reference for all purposes.

FIELD OF THE INVENTION

The present invention relates in general to connectors and connector systems for electronic devices, and in particular to universal serial bus connectors and methods of operation of the same.

BACKGROUND OF THE INVENTION

The Universal Serial Bus (USB) is a standardized interface for data communications between electronic devices. Electronic devices which incorporate the USB may communicate with each other utilizing standard connectors and interface protocols.

The USB as originally designed is based on a master-slave protocol wherein a host system (master) may connect to one or more peripheral devices (slaves) in a tiered star topology. The host system may control several peripheral devices through a series of hubs. The host system determines how connections and communications are made to the peripheral devices, and therefore the intelligence resides primarily in the host system.

USB uses directional connectivity wherein one type of connection (mating pair of plug and receptacle) is used to connect to an upstream host device and a different type of connection is used to connect to a downstream peripheral device. A host, according to the USB specification, may include a Series A receptacle that only connects to a Series A plug, while a peripheral device may include a Series B receptacle that only connects to a Series B plug. The connection between such host and peripheral device is thus made by a USB cable with a Series A plug at one end and a Series B plug at the other. Other peripheral devices, such as a memory stick, may be equipped with a Series A plug in which case direct connection between the peripheral device and the host can be made without a cable. USB also envisions that the host acts as the source of power.

This directional connectivity as well as the power distribution requirement as defined by the USB specification place certain limitations on the interconnectivity of electronic systems using the Series A/Series B connectors. For example, an electronic device that may be able to act as a host in one mode of operation and as a peripheral device in another mode of operation cannot, by definition, use the same Series A port in both modes of operation. While USB has defined a separate interface, called On-The-Go (OTG), for dual role devices (i.e., devices that can be configured to operate either as a host device or a peripheral device), the USB OTG specification requires different connectors (Mini-A, Mini-B and Mini-A/B) that do not mate with the Series A and Series B connectors.

Therefore, dual role electronic devices that need a Series A port must also provide an additional connection port to enable them to connect to a host when operating as a peripheral device.

BRIEF SUMMARY OF THE INVENTION

Various embodiments of the invention include a modified Series A universal serial bus (USB) receptacle connector that is compatible with a standard USB Series A plug connector, and that can be operated either as a host port or a peripheral port. According to one embodiment, the modified USB Series A receptacle may include a mechanism such as an additional pin or a switch to detect the insertion of a standard USB Series A plug. Upon detection of a plug, an algorithm may allow the system in which the modified Series A receptacle resides to determine whether it is to operate in host mode or peripheral mode.

Accordingly, in one embodiment, the invention includes a modified USB Series A receptacle connector including a metallic housing, an extension plate disposed inside the metallic housing and spaced away from inside walls of the metallic housing, a plurality of receptacle contact pins disposed on a first side of the extension plate and configured to mate with a corresponding plurality of plug contact pins in a standard USB Series A plug connector, the plurality of receptacle contact pins including a power pin, a ground pin, and two data pins, and a plug detector that is configured to detect an insertion of the standard USB Series A plug connector into the modified USB Series A receptacle connector while power is withheld from the power pin of the receptacle connector.

Another embodiment of the invention may include a method of operating an electronic device having a modified Series A universal serial bus (USB) receptacle connector, the method including electronically detecting the insertion of a standard USB Series A plug connector into the modified USB Series A receptacle connector while withholding VBus power to the modified USB receptacle connector.

Yet another embodiment of the invention may include a method of operating an electronic device having a modified USB Series A receptacle connector, the method including withholding the supply of power to a power pin of the receptacle connector, detecting insertion of a USB Series A plug and generating a plug detect signal, monitoring the power pin of the receptacle connector in response to the plug detect signal, and configuring the electronic device to operate in either a host mode or a peripheral mode in response to what is monitored on the power pin.

To better understand the nature and advantages of the invention, reference should be made to the following description and the accompanying figures. It is to be understood, however, that each of the figures is provided for the purpose of illustration only and is not intended as a definition of the limits of the scope of the present invention.

DETAILED DESCRIPTION OF THE INVENTION

Figure 1A:
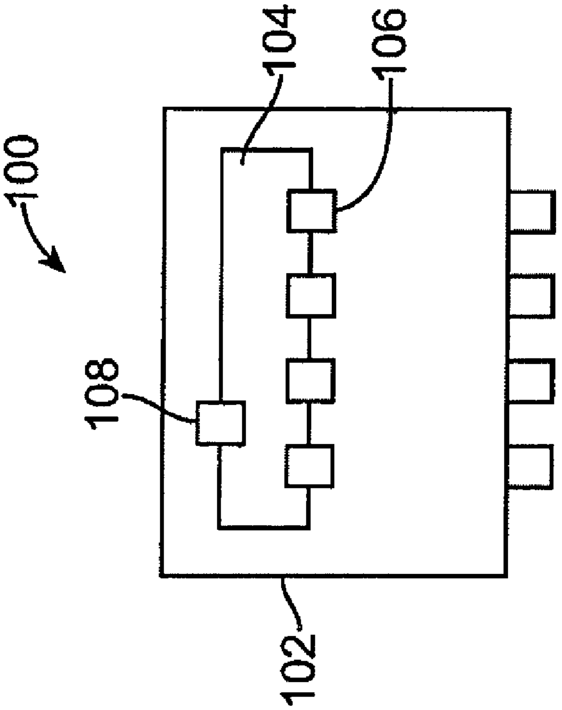
FIG. 1A shows a simplified front view of a modified USB Series A receptacle, according to one embodiment of the invention.
Figure 1B:
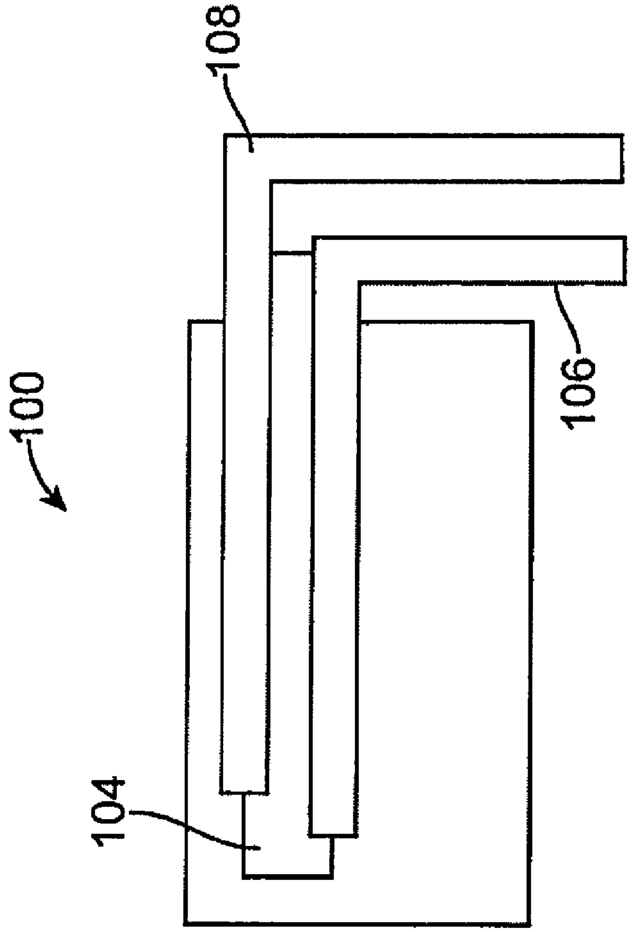
FIG. 1B shows a simplified side view of a modified USB Series A receptacle, according to one embodiment of the invention.

FIGS. 1A and 1B show simplified front and side views of a modified USB Series A receptacle 100, in accordance with one embodiment of the present invention. The modified USB Series A receptacle 100 includes a metallic housing (or shell) 102, an extension plate 104 that is disposed inside metallic housing 102 and is spaced away from the inside walls of the housing, and a plurality of contact pins 106. The plurality of contact pins includes a power pin, a ground pin, and two data pins corresponding to the USB pins. The modified USB Series A receptacle 100 also includes a plug detector 108 which may be disposed on the extension plate 104. In the exemplary embodiment shown in FIG. 1A, the plug detector 108 may be a pin that engages with the shield of a standard USB Series A plug. In an alternative embodiment, the plug detector 108 may be a switch, which is moveable and activated through the physical insertion of the standard USB Series A plug. In other embodiments, the plug detector 108 may use a capacitive or inductive sensor to detect the insertion of a plug. The plug detector 108 operates as a stand alone feature that is independent of and electronically transparent to the data and power connections of the standard USB Series A plug. An electronic device attached to the standard USB Series A plug may not be aware of the plug detector 108 or have the ability to communicate through the plug detector 108.

Figure 2A:
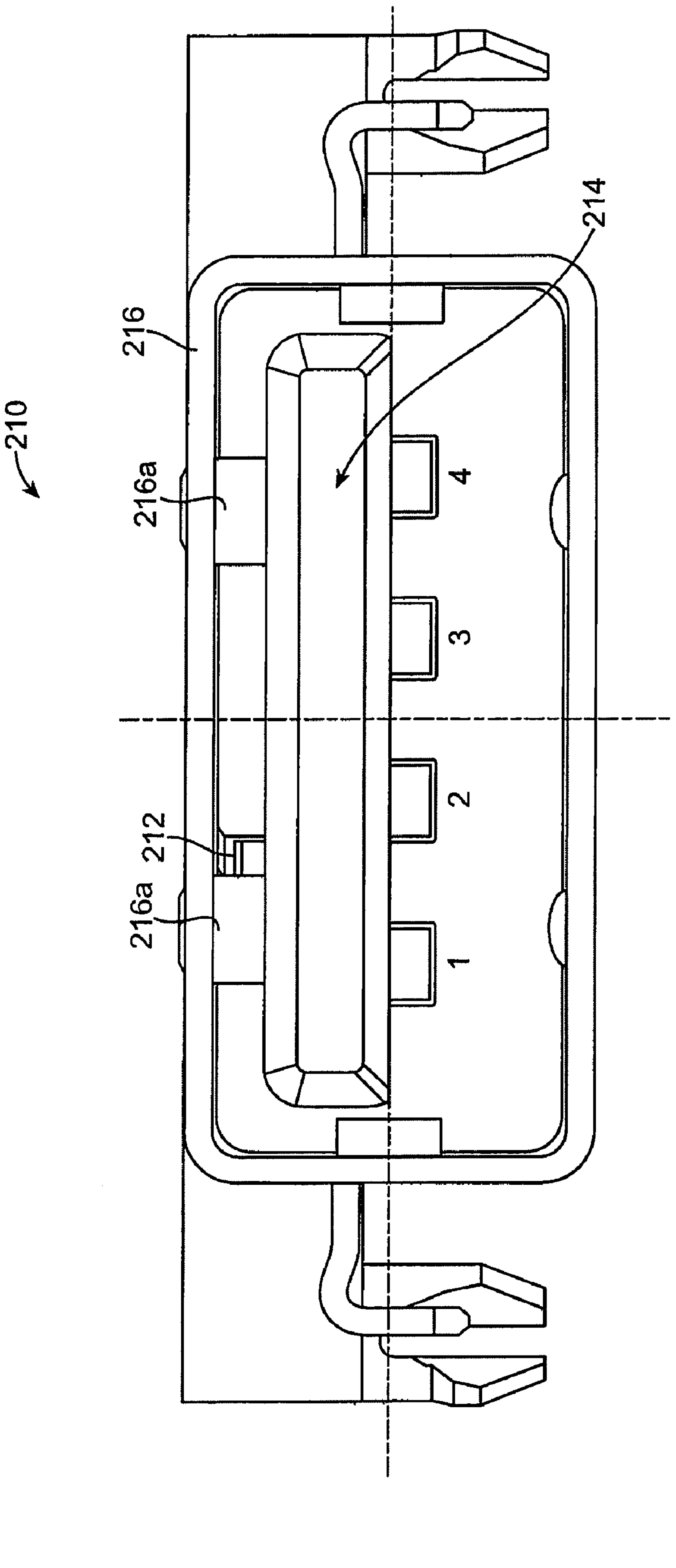
FIG. 2A shows a front view of a modified USB Series A receptacle in greater detail, according to one embodiment of the invention.
Figure 2B:
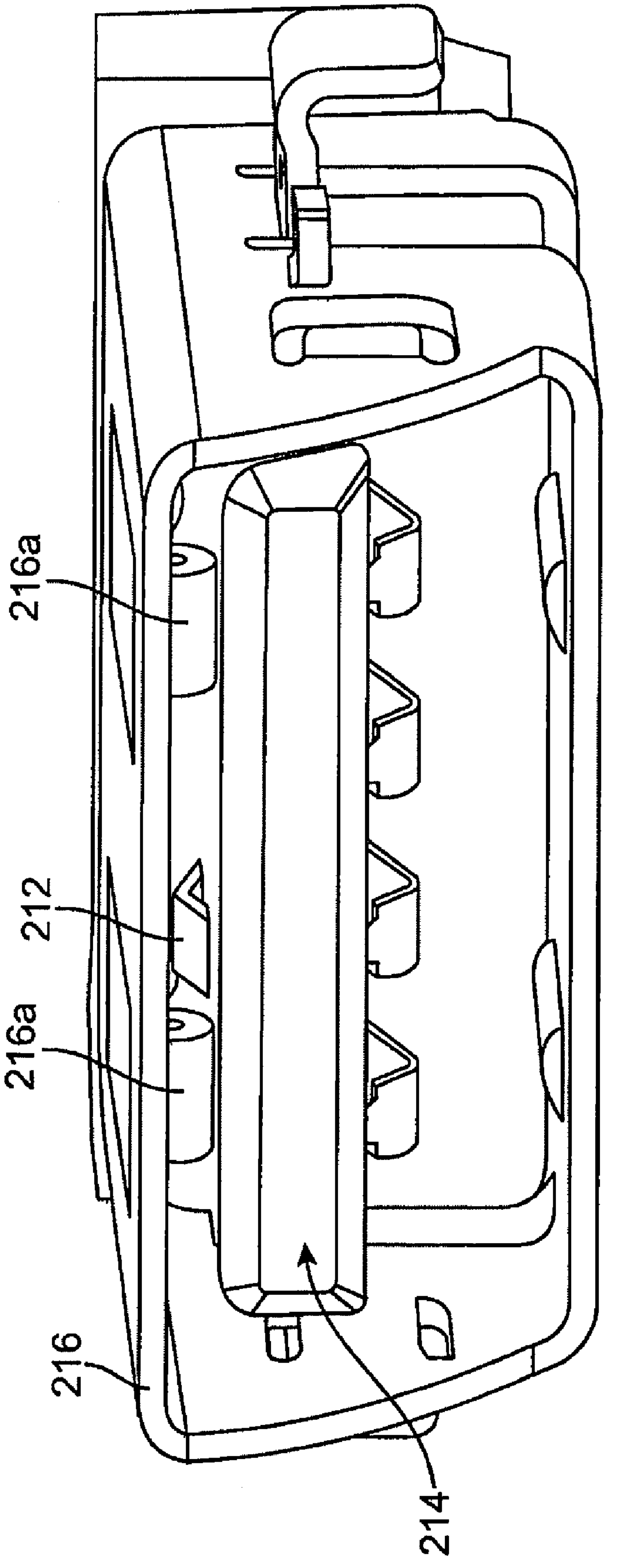
FIG. 2B shows a perspective view of a modified USB Series A receptacle, according to one embodiment of the invention.

FIGS. 2A and 2B show a more detailed front and perspective views of the a modified USB Series A receptacle 210, according to one embodiment of the invention. The modified USB Series A receptacle 210 will accept a standard USB Series A plug (not shown). The modified USB Series A receptacle 210 includes extension plate 214 and metallic housing 216. The metallic housing 216 further includes two mechanical detents **216*a* for retaining a standard USB Series A plug. A plug detection mechanism 212 is also included which may be in the form of a contact pin or switch that engages the standard USB Series A plug. In the exemplary embodiment shown in FIG. 2A, plug detection mechanism 212 may be a contact pin. Contact pin 212 may be further connected to circuitry such as a resistive pull-up element (not shown) to implement the plug detection function. In one example, the contact pin 212 may be a spring tab of sufficient thickness and dimensions to fit between the extension plate 214 and the shell of the standard USB Series A plug. The extension plate 214 may be modified to allow the tab 212 to fit within it. In this example, upon contact with the shell of the standard USB Series A plug, contact pin 212 is grounded and can thus signal the presence of the plug. The modified USB Series A receptacle 210 may have the following electrical characteristics: current rating of about 1 Amp; a contact resistance of about 30 mΩ; a dielectric withstand voltage of about 750 VAC and an insulation resistance of about 1000 MΩ. The modified USB Series A receptacle 210** may have the following mechanical characteristics: connector engagement force of about 3.5 Kgf; connector separation force of about 1.0 KgF and durability of about 5000 cycles.

Alternatively the plug detection mechanism 212 may be a switch or a spring tab of sufficient thickness and dimensions to fit between the metallic housing 216 and the housing of the standard USB Series A plug. According to this embodiment, the plug housing may toggle the switch 212 as the shell of the standard USB series A plug is inserted into the shell of the receptacle. The toggling of the switch can trigger detection circuitry that generates a detection signal. Other mechanisms for detection of the plug may use capacitive or inductive sensors wherein a change in value of capacitance or inductance caused by the insertion of the plug is detected thereby generating a detection signal.

Figure 2C:
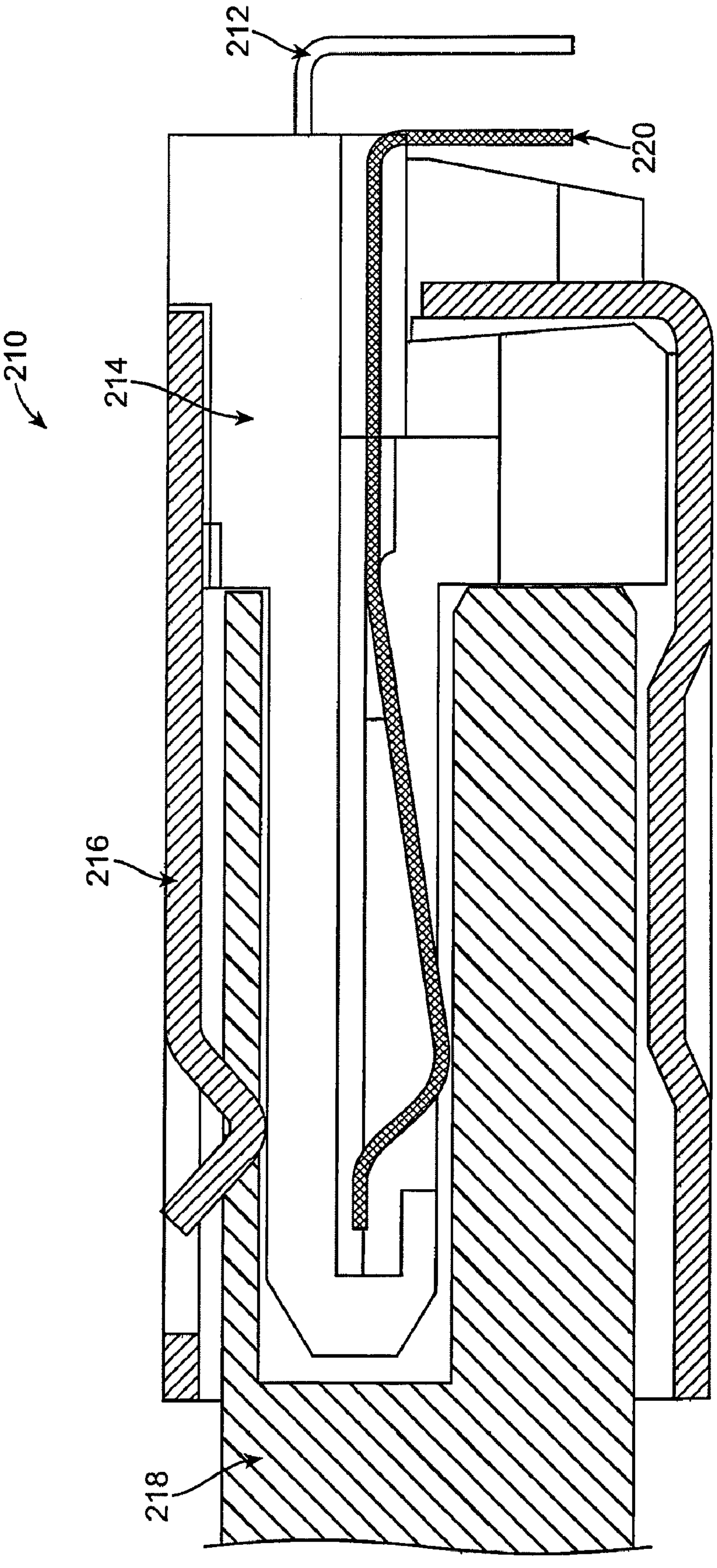
FIGS. 2C and 2D show two different cross-sections of a modified USB Series A receptacle engaging a standard USB Series A plug, according to one embodiment of the invention.

FIG. 2C shows a cross-section of an exemplary modified USB Series A receptacle 210 attached to a standard USB Series A Plug 218. The view is taken at a point bisecting one of four standard pin connectors 220. In use, the standard USB Series A Plug 218 may be engaged to the metallic housing 216 by the mechanical detent **216*a* as shown. The standard pin connector 220 is also engaging the standard USB Series A Plug 218. The rear of the tab 212** is also shown.

Figure 2D:
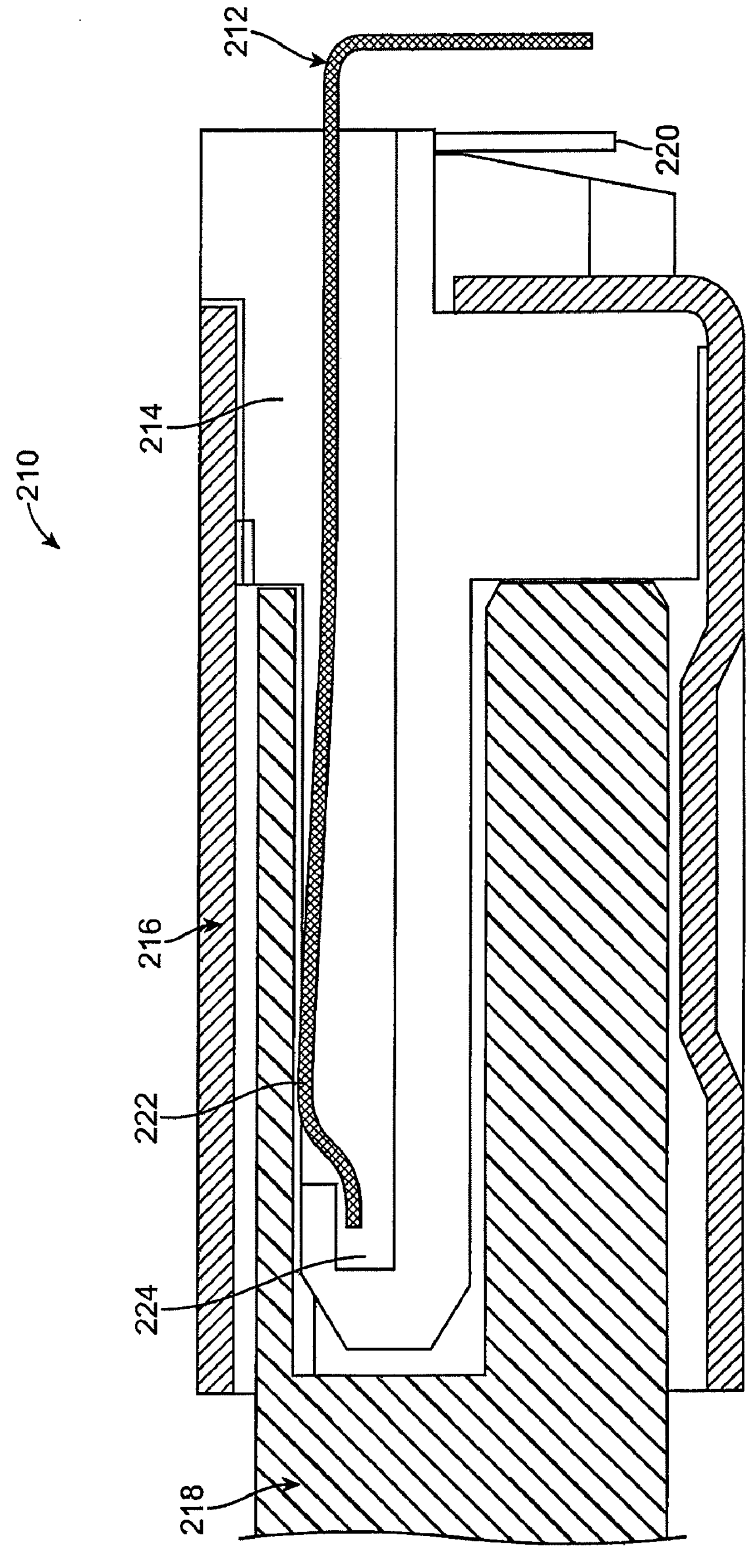

FIG. 2D shows another cross-section of the exemplary modified USB Series A receptacle 210 attached to a standard USB Series A Plug 218. The view is taken at a point bisecting the plug detection mechanism 212 which in this example is another contact pin. In use the contact pin 212 may engage the shell of the standard USB Series A Plug 218 at location 222. The extension plate 214 may be modified to allow the tab 212 to fit within it as shown in region 224. The rear of one of the four standard pin connectors 220 is also shown. Thus in the example shown, the tab 212 may engage standard USB Series A Plug 218 and be implemented in circuitry as a plug detector.

Figure 3A:
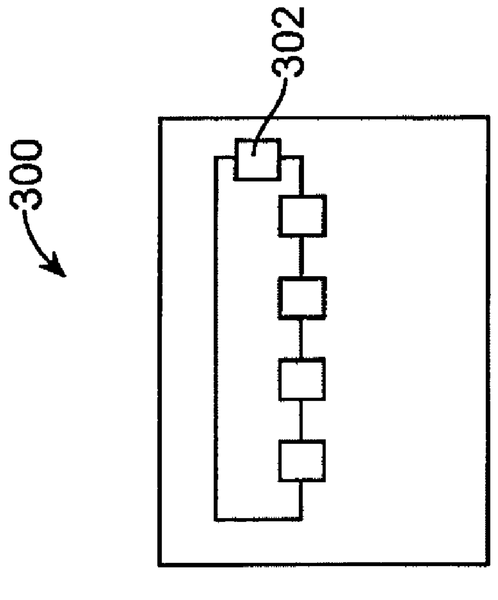
FIG. 3A shows a simplified front view of a modified USB Series A receptacle, according to another embodiment of the invention.
Figure 3B:
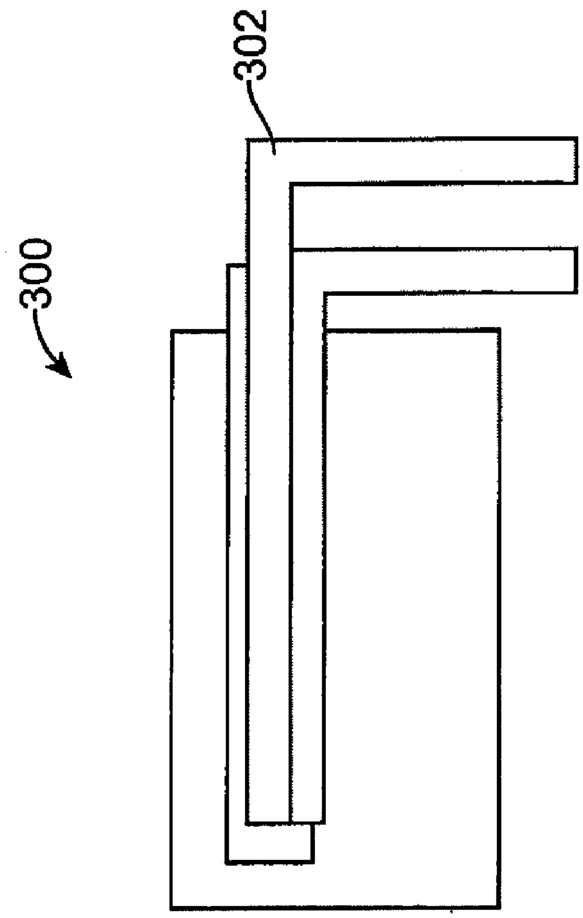
FIG. 3B shows a simplified side view of the modified USB Series A receptacle of FIG. 3A, according to one embodiment of the invention.

FIGS. 3A and 3B show simplified diagrams for a modified USB Series A receptacle 300, according to another embodiment of the invention. The modified USB Series A receptacle 300 is largely constructed in the manner of the modified USB Series A receptacles described above in connection with FIGS. 1A, 1B, and 2A through 2D, with the exception of the location of the plug detector 302. According to this embodiment, instead placing the plug detector 302 on the reverse side of the extension plate 304, the plug detector 302 may be disposed on either side of the extension plate 304.

Figure 4:
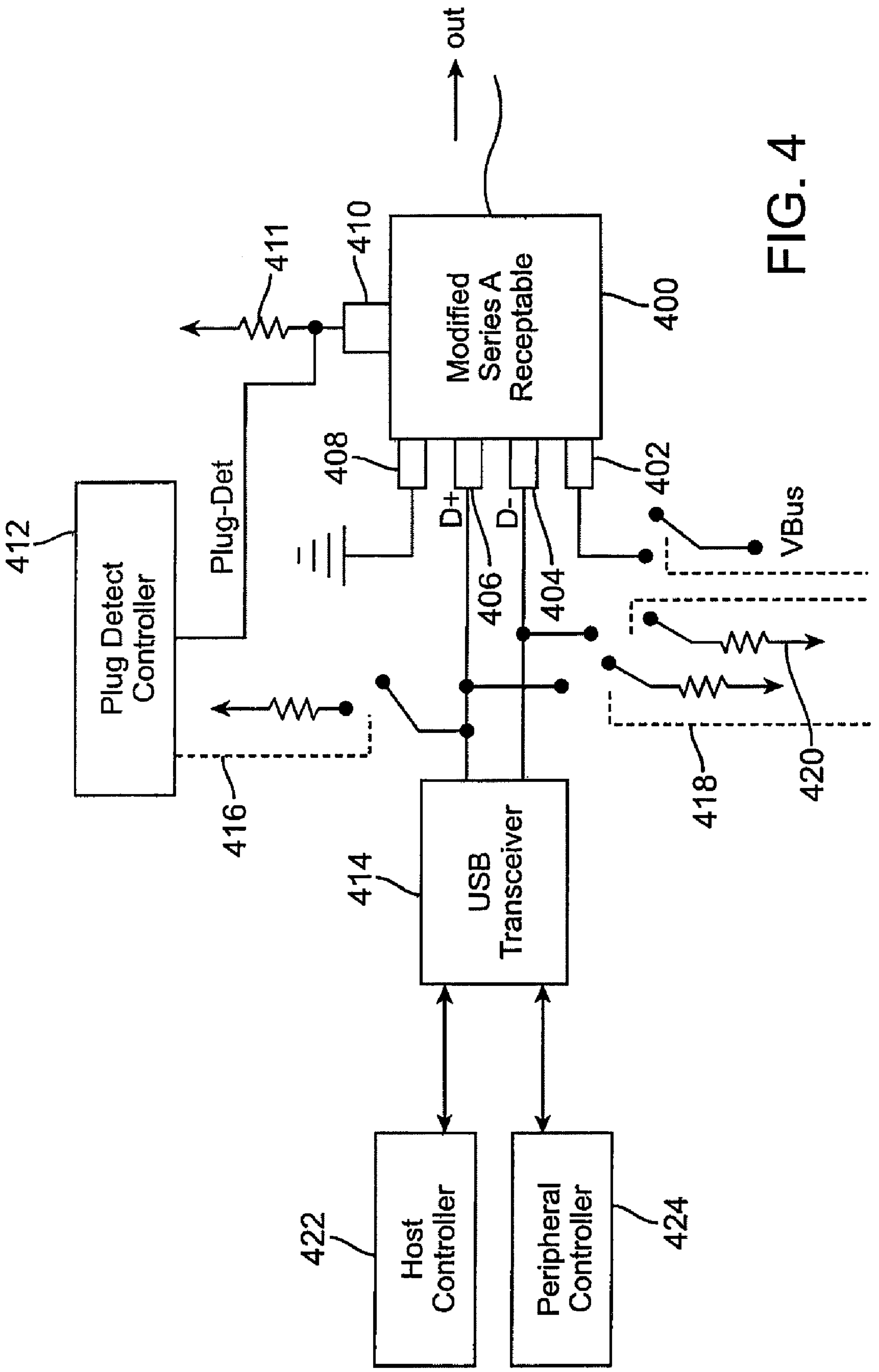
FIG. 4 shows a high-level block diagram of a system using a modified USB Series A receptacle, according to one embodiment of the invention.

Referring now to FIG. 4, there is shown a high level block diagram of an electronic system using a modified USB Series A receptacle 400 according to one embodiment of the invention. The receptacle 400 includes four pins, 402, 404, 406, and 408 and a plug detector 410. Pin 402 may be connected to a switched power connection (e.g. VBus), which may supply power to the modified USB Series A receptacle 400. Pin 404 may be data connection line D−. Pin 406 may be data connection line D+. Pin 408 may be connected to ground. The plug detector 410, in this example, is a pin connected to a pull-up circuit which may include a resistive element 411 that connects to a logic high signal (e.g., power supply). When the grounded shield of the standard USB Series A plug is inserted into the modified USB Series A receptacle 400, the shield may come into contact with the plug detector 410. Upon contact between the grounded shield of the plug and the plug detector pin 410, pin 410 is grounded generating a logic low signal Plug_Det that indicates a standard USB Series A plug has been inserted. The Plug_Det signal is relayed to a plug detect controller 412. The plug detect controller 412 may be logic circuitry which controls the modified USB Series A receptacle 400, and may be implemented in a combination of firmware, software or hardware. The primary function of the plug detect controller 412 may be the control of power connections to one or more pins of the receptacle. While shown as a separate block, plug detect controller 412 may be implemented as part of the USB transceiver 414, host controller 422 or peripheral controller 424. The USB transceiver 414 may generally be described as logic circuitry for enabling data signaling through the USB. The USB transceiver 414 may be configured as an upstream (host) or downstream (peripheral) facing transceiver through the plug detect controller 412. The Universal Serial Bus Specification, Revision 2.0, allows a USB transceiver to be configured only in one mode; downstream facing for standard USB Series A receptacles and upstream facing for standard USB Series B receptacles. In an upstream facing mode (i.e., peripheral device mode), the plug detect controller 412 causes the USB transceiver 414 to be configured in peripheral mode of operation, identifying to a second host connected to the modified USB Series A receptacle 400 that a peripheral device is present. In a downstream facing mode (i.e., host mode), the plug detect controller 412 causes the USB transceiver 414 to be configured in host mode of operation and supplies power to the VBus pin 402 to enable control over a peripheral device connected to the modified USB Series A receptacle 400.

When the USB transceiver 414 is in the host or downstream facing mode, the plug detect controller 412 may couple the USB transceiver 414 with a host controller 422. The host controller 422 may control the USB transceiver 414 until a connected peripheral device is disconnected from the modified USB Series A receptacle 400. When the USB transceiver 414 is in the peripheral or upstream facing mode, the plug detect controller 412 may couple the USB transceiver 414 with a peripheral controller 424. The peripheral controller 424 may facilitate communication with the USB transceiver 414 until a connected host device is disconnected from the modified USB Series A receptacle 400.

Figure 5A:
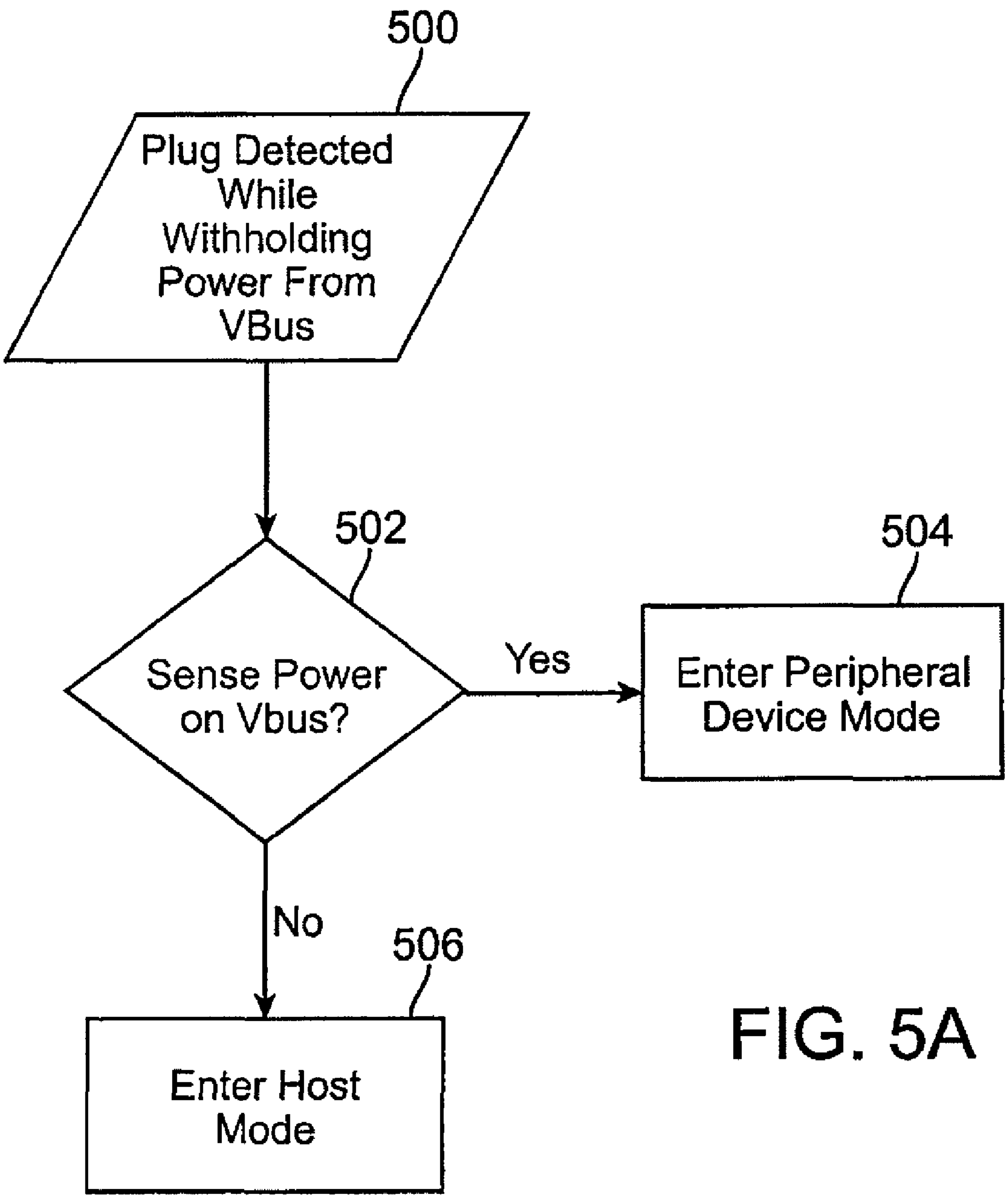
FIG. 5A is a flow diagram illustrating a method for operating an electronic device with a modified USB Series A receptacle, according to one embodiment of the invention.

FIG. 5A is a simplified flow diagram illustrating a method for operating an electronic device having a modified USB Series A receptacle connector, according to one embodiment of the invention. At operation 500 a plug detector may detect that a standard USB Series A Plug connector has been inserted into the modified USB Series A receptacle connector, while withholding VBus power. That is, the detection is performed without power being supplied to the VBus pin of the receptacle. This can be implemented as described above in connection with the various embodiments of the modified USB Series A receptacle. At operation 502 it may be determined whether the modified USB Series A receptacle connector is receiving VBus power from the standard USB Series A Plug connector. If the attached standard USB Series A Plug connector is delivering power, then at operation 504 the electronic device may enter a peripheral mode of operation. If the attached standard USB Series A Plug connector is not delivering power, then at operation 506 the electronic device may enter a host mode of operation.

Figure 5B:
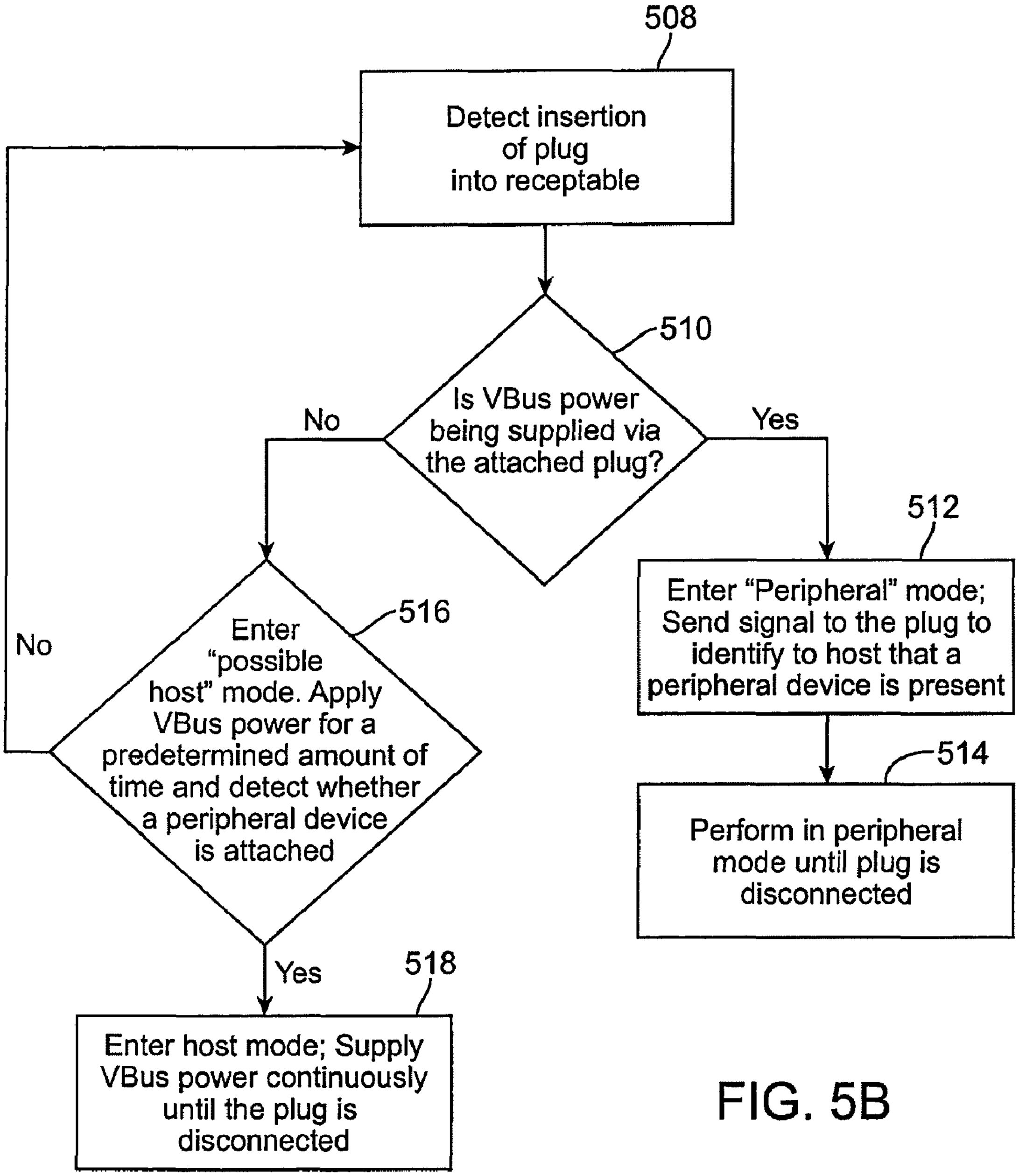
FIG. 5B is a more detailed flow diagram illustrating a method of operating an electronic device with a modified USB Series A receptacle according to one embodiment of the invention.

FIG. 5B is a more detailed flow diagram illustrating a method for operating an electronic device having a modified USB Series A receptacle connector, according to one embodiment of the invention. At operation 508 a plug detector detects that a standard USB Series A Plug connector has been inserted into the modified USB Series A receptacle connector. Again, this detection function does not require power and therefore no power is supplied by the electronic device to the power (VBus) pin of the modified USB Series A receptacle connector. A standard USB system requires that the host device determines and controls the connection. A standard USB Series A receptacle connector requires that power be supplied by the host system to the VBus pin. In this embodiment, since the electronic device can connect to either a peripheral device or a host device and therefore it can operate in either of the complementary modes of operation, it first determines whether it is connected to a host or a peripheral device before supplying power to the modified USB Series A receptacle connector pins. Therefore, at operation 508 it may be unknown whether a peripheral or host device has connected.

At operation 510 the electronic device may detect the status of the VBus pin to determine whether VBus power is being supplied to the modified USB Series A receptacle connector via the inserted standard USB Series A Plug connector. If the electronic device determines that power is being supplied, then it will assume that it is connected to a host device capable of supplying power.

At operation 512 the electronic device enters peripheral device mode of operation and configures itself to operate as a peripheral device. It does so in part by pulling up the D+pin indicating to the host that a peripheral device is present. At operation 514 the electronic device may continue to operate in a peripheral device mode until the standard USB Series A Plug connector is disconnected from the modified USB Series A receptacle connector.

Referring back to operation 510, if it is determined that no VBus power is being supplied via the inserted USB Series A plug, the electronic device will enter a "possible host" mode in operation 516. At operation 516 the electronic device may apply VBus power to the VBus pin of the modified USB Series A receptacle connector for a predetermined amount of time, (e.g. 100-250 milliseconds). While the VBus power is being applied, the electronic device monitors its pins to determine whether a peripheral device has attached, which would be indicated by a high signal on one of the two (D+ or D−) data lines. If no signal is detected then the method would cycle back to operation 508.

If a signal is detected then the electronic device will switch from "possible host" mode to a normal host mode, as shown in operation 518. The electronic device will supply VBus power and control the attached peripheral device until the attached peripheral device is disconnected from the modified USB Series A receptacle connector. In some embodiments it might be desirable to include a small wait state between operations 508 and 510 to minimize any residual potential for bus contention.

Figure 6:
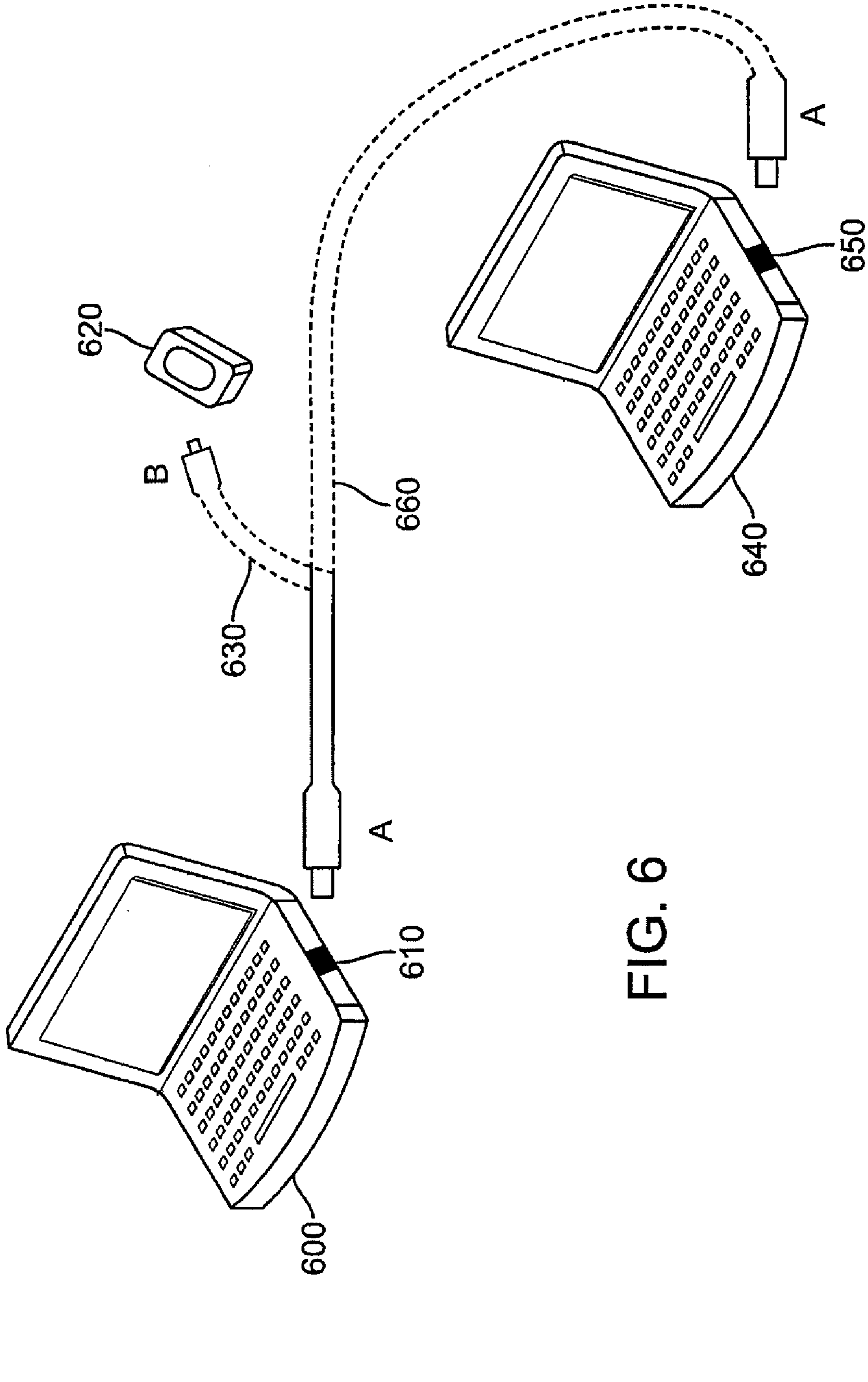
FIG. 6 shows an exemplary connection system for electronic devices with a modified USB Series A receptacle, according to one embodiment of the invention.

FIG. 6 shows an exemplary system of electronic devices that may be connected using USB including the modified USB Series A receptacle connector according to one embodiment of the invention. In this example, a computer device 600 includes a modified USB Series A receptacle connector 610. The computer device 600 is shown connected to a peripheral device 620. The computer device 600 may be connected to the peripheral device 620 as a host. A standard cable 630 connects the computer device 600 and the peripheral device 620. The standard cable 630 includes a standard USB Series A Plug connector at the computer device 600 and a standard or mini USB Series B Plug connector at the peripheral device.

Computer device 600 may also be connected to second computer device 640 via the modified USB Series A receptacle connector 610. The second computer device 640 may include a standard or modified USB Series A receptacle connector 650. The second computer device 650 may operate as a host device if the second computer device 640 includes a standard USB Series A receptacle connector 650. Both the computer device 600 and the second computer device 650 may operate as peripheral or host devices if both include modified USB Series A receptacle connectors. The computer devices are connected by a modified cable 660. The modified cable includes standard USB Series A Plug connectors at both ends, a unique configuration which has no application and is not permitted under the Universal Serial Bus Specification. The modified USB Series A receptacle connector according to the present invention, however, allows for connectivity using such cable.

The modified USB Series A receptacles as well as the connectors, cables and electronic systems made employing the same as described above offer advantages over prior art devices. The modified USB Series A receptacle remains compatible with a standard USB Series A plug while enabling both host and peripheral connectivity. This eliminates the need to add a USB Series B receptacle to dual mode devices that utilize USB Series A connection, reducing size, components and therefore cost. It should be noted that the present invention is applicable to all revisions of the USB specifications, including the current Revision 2 as well as those defined before Revision 2.0 and future revisions including the proposed Revision 3.0.

As will be understood by those skilled in the art, the present invention may be embodied in other specific forms without departing from the essential characteristics thereof. Those skilled in the art will recognize, or be able to ascertain using no more than routine experimentation, many equivalents to the specific embodiments of the invention described herein. Such equivalents are intended to be encompassed by the following claims.

What is claimed is:

1. A method performed by an electronic device having a modified Universal Serial Bus (USB) Series A receptacle connector, the method comprising:

detecting, by the electronic device, insertion of a standard USB Series A plug connector into the modified USB Series A receptacle connector; and in response to the detecting, determining, by the electronic device, whether to enter a host mode of operation or a peripheral mode of operation.

2. The method of claim 1 wherein the detecting is performed while withholding the supply of power to a power pin of the modified USB Series A receptacle connector.

3. The method of claim 1 wherein the detecting comprises receiving a plug detection signal from a plug detector located on the modified USB Series A receptacle connector.

4. The method of claim 3 wherein the plug detector is a contact pin, a switch, or a spring tab.

5. The method of claim 3 wherein the plug detector is independent of data and power pins located on the modified USB Series A receptacle connector.

6. The method of claim 1 wherein the determining comprises detecting whether power is being supplied by the standard USB Series A plug connector.

7. The method of claim 6 wherein the determining further comprises:

if power is being supplied by the standard USB Series A plug connector, entering the peripheral mode of operation; and if power is not being supplied by the standard USB Series A plug connector, entering a possible host mode of operation.

8. The method of claim 7 wherein entering the possible host mode of operation comprises:

supplying power to the standard USB Series A plug connector for a predetermined period of time; and while the power is being supplied to the standard USB Series A plug connector, determining whether an indication is received from the standard USB Series A plug connector that a peripheral device is attached.

9. The method of claim 1 wherein the host mode of operation corresponds to USB host mode and wherein the peripheral mode of operation corresponds to USB peripheral mode.

10. An electronic device comprising:

a modified Universal Serial Bus (USB) Series A receptacle connector, wherein the electronic device is configured to detect insertion of a standard USB Series A plug connector into the modified USB Series A receptacle connector and, in response to the detecting, determine whether to enter a host mode of operation or a peripheral mode of operation.

11. The electronic device of claim 10 wherein the electronic device does not include a USB Series B receptacle connector.

12. The electronic device of claim 10 wherein the modified USB Series A receptacle connector comprises:

a metallic housing;

an extension plate disposed inside the metallic housing and spaced away from inside walls of the metallic housing;

a plurality of receptacle contact pins disposed on a first side of the extension plate and configured to mate with a corresponding plurality of plug contact pins in the standard USB Series A plug connector;

and a plug detector separate from the plurality of receptacle contact pins.

13. The electronic device of claim 12 wherein the plurality of receptacle contact pins include a power pin, a ground pin, and two data pins.

14. The electronic device of claim 13 wherein the electronic device is configured to detect insertion of the standard USB Series A plug connector via the plug detector while power is being withheld from the power pin.

15. The electronic device of claim 12 wherein the plug detector is disposed on the first side of the extension plate.

16. The electronic device of claim 12 wherein the plug detector is disposed on a second side of the extension plate opposite the first side.

17. An electronic device comprising:

a Universal Serial Bus (USB) transceiver;

a plug detect controller; and a modified USB Series A receptacle connector, wherein the plug detect controller is configured to:

receive a signal from a plug detector disposed in the modified USB Series A receptacle connector indicating that a standard USB Series A plug connector has been inserted into the modified USB Series A receptacle connector; and in response to receiving the signal, determine whether to configured the USB transceiver as an upstream-facing transceiver or a downstream-facing transceiver.

18. The electronic device of claim 17 wherein configuring the USB transceiver as an upstream-facing transceiver includes coupling the USB transceiver with a USB host controller.

19. The electronic device of claim 17 wherein configuring the USB transceiver as a downstream-facing transceiver includes coupling the USB transceiver with a USB peripheral controller.

* * * * *